United States Patent [19]

Kawasaki

[11] Patent Number: 5,031,045
[45] Date of Patent: Jul. 9, 1991

[54] CATV TERMINAL DEVICE HAVING A PROGRAM BOOKING TIMER FUNCTION

[75] Inventor: Masahiko Kawasaki, Tokyo, Japan

[73] Assignee: Pioneer Electronic Corporation, Tokyo, Japan

[21] Appl. No.: 547,360

[22] Filed: Jul. 3, 1990

[30] Foreign Application Priority Data

Nov. 13, 1989 [JP] Japan ................................. 1-292468

[51] Int. Cl.$^5$ ........................... H04N 5/44; H04N 7/18
[52] U.S. Cl. ................................... 358/191.1; 358/86; 455/181
[58] Field of Search ................... 358/191.1, 86, 193.1, 358/320; 455/3, 6, 171, 175, 181, 186, 182

[56] References Cited

U.S. PATENT DOCUMENTS

| 4,737,993 | 4/1988 | DeVilbiss | 358/191.1 |
| 4,742,564 | 5/1988 | Dumont | 455/186 |
| 4,805,230 | 2/1989 | Tanaka | 455/182 |
| 4,954,899 | 9/1990 | Tanbe | 358/191.1 |

Primary Examiner—Tommy P. Chin
Attorney, Agent, or Firm—Sughrue, Mion, Zinn, Macpeak & Seas

[57] ABSTRACT

The CATV terminal device has a first and a second memory, a decision circuit, and a channel number modifying circuit. The CATV terminal device periodically receives channel data, which is stored in the second memory. The channel data contains channel numbers representing channels on which TV programs can be received. When a person selects a desired channel as by operating a key input section, a control circuit checks if the selected channel number, which is stored in the first memory, is the one contained in the channel data. If not, the control circuit increments or decrements the selected channel number by the channel number modifying circuit until it finds a channel number contained in the channel data which is available for TV program reception. The channel number thus chosen will be set as a channel number to be turned when the present time on the timer comes. This prevents channel numbers not available for reception from being selected inadvertently during the timer setting procedure.

8 Claims, 4 Drawing Sheets

CHANNEL 2 : CBS

CHANNEL 3 : NOT USED

CHANNEL 4 : NBC

CHANNEL 5 : NTV

CHANNEL 6 : ABC

CHANNEL 7 : NOT USED

CHANNEL 8 : CNN
. . . . . . . . . . .
CHANNEL 61 : . . . . .

CATV TERMINAL DEVICE HAVING A PROGRAM BOOKING TIMER FUNCTION

BACKGROUND OF THE INVENTION

1. Field of the Invention

The present invention relates to a CATV (Community Antenna Television) Terminal Device and more particularly to a CATV terminal device which has a program booking timer function.

2. Description of the Prior Art

In common CATV terminal devices, when one wants to preset a program using a timer function, one needs to operate, as with the video cassete recorders (VCR) or the like, a key input section of the CATV terminal device to set the channel number, start time, end time, and day of the week and store these information in memory.

The CATV system has as large a number of channels as 61. So, any one of the 61 channels can be chosen for timer setting. Although the CATV system has that many channels, not all of them are available to users. In America, there are some unused channels on which no video signals are aired, such as channels 3 and 7; some channels broadcast pay TV programs only available to contracted subscribers.

In the above-mentioned CATV system, since there are many channels in which video signals cannot be received, there is a good chance that a person may select a wrong channel number during the timer setting. If that happens, the CATV terminal device will turn on the wrong channel at the preset start time and receive noise until the terminal device is turned off at the preset end time. If in this case a video cassete recorder (VCR) is used to record a TV program selected on the timer, only noise will be recorded on the tape.

This invention has been accomplished to solve the above-mentioned problem experienced with the conventional CATV terminal devices. It is therefore an object of the invention to provide a CATV terminal device which totally eliminates the possibility that channel numbers in which no video signals are broadcast may be selected in the timer setting even if a person has done a wrong channel number setting.

SUMMARY OF THE INVENTION

To achieve the above objective, the CATV terminal device according to this invention has the following configuration. As shown in the schematic diagram of FIG. 1, the CATV terminal device which, at a preset time on a timer, turns on a channel specified by a channel number that was stored in a first memory means 25a by the timer setting procedure, comprises: a first memory means 25a to store a channel number set by a TV program booking procedure using timer function; a second memory means 25b to store channel data, said channel data containing information about channels that can be used for TV program reception; a decision means 23a to check, according to the channel data stored in the second memory means 25b, if the channel number stored in the first memory means 25a represents a channel available for reception; and a channel number modifying means 23b to change the channel number stored in the first memory means 25a, when the channel specified by that channel number is determined by the decision means 23a as being not available for reception, to one of channel numbers contained in the channel data stored in the second memory means 25b, these channel numbers in the channel data being available for reception.

In this configuration, information on the channels on which video signals can be received by the CATV terminal device is stored as channel data in the second memory means 25b. The decision means 23a checks, according to the channel data, whether the channel numbers set in the first memory means 25a represent the channels available for video signal reception. If the decision means 23a determines that the channel number set in the first memory means 25a is not available for reception, the selected channel number is changed by the channel number modifying means 23b to one of the channel numbers contained in the channel data that are good for reception.

Therefore, during the channel selection in the timer setting operation if an operator erroneously sets a channel number not available for video signal reception, the channel number selected in the timer is automatically changed to a different channel number which is good for reception. This prevents any invalid channels from being selected. And when a TV program chosen by the timer is to be recorded by VCR, wrong channel selection on the part of an operator will not result in noise being recorded during the timer-set period.

PREFERRED EMBODIMENT OF THE INVENTION

One embodiment of this invention will now be described by referring to the attached drawings.

Figure 1:
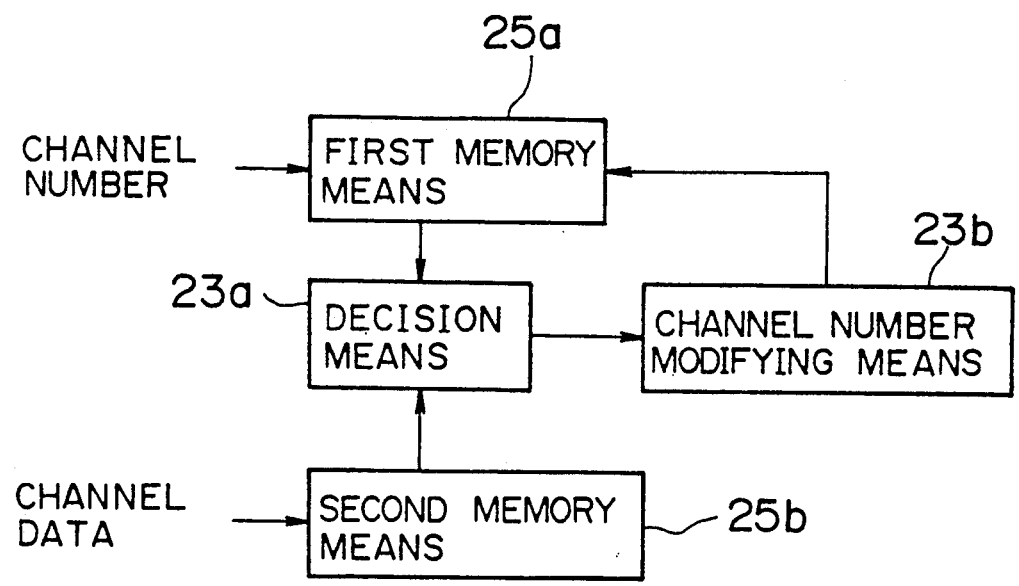
FIG. 1 is a block diagram showing the basic configuration of the CATV terminal device according to this invention.
Figure 2:
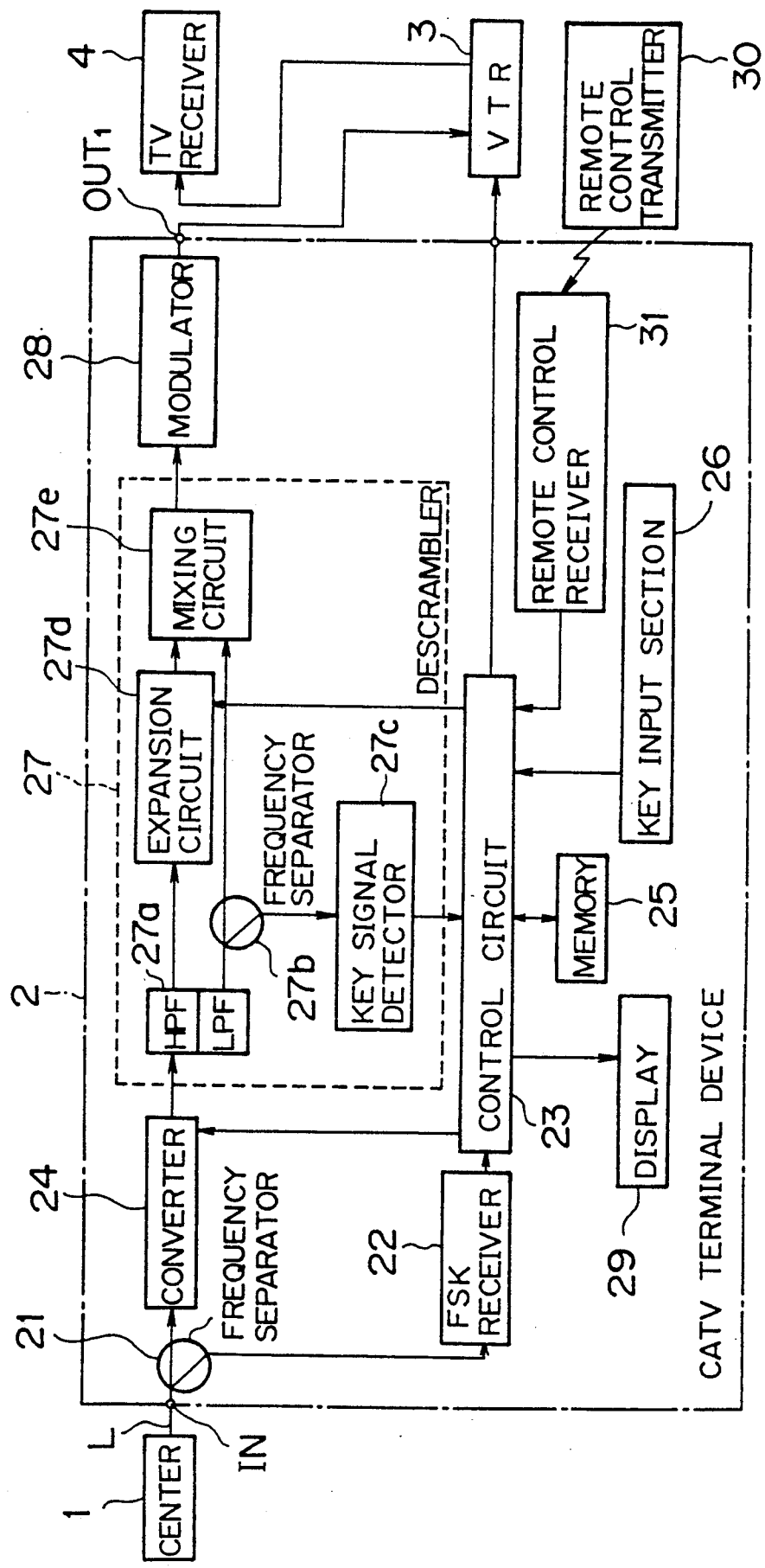
FIG. 2 is a block diagram showing one embodiment of the invention.

FIG. 2 is a block diagram showing one embodiment of a CATV terminal device according to this invention which has a program booking timer function. In the figure, a signal transmitted over a coaxial cable L from a center 1 is given to an input terminal IN of the CATV terminal device 2 and then applied to a frequency separator 21 where it is branched in two ways. One of the branched signal is fed from the frequency separator 21 to an FSK (frequency-shift keying) receiver 22 that selects and receives outband data. From the FSK receiver 22 the signal is further sent to a control circuit 23, which consists of a CPU that operates according to a predetermined program. An RF signal branched by the frequency separator 21 is entered into a converter 24.

Figures 3, 4:
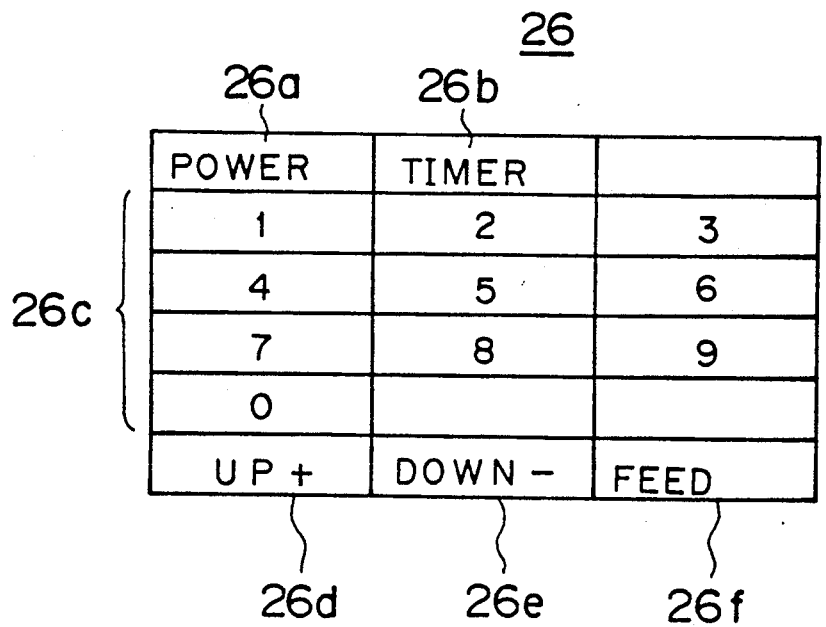
FIG. 3 is a list showing one example of channel data.
FIG. 4 is a table showing the key arrangement on a key input section.

The FSK receiver 22 is used to detect the outband data transmitted from the center 1. The outband data includes channel data specifying the channels available for TV program reception by the CATV terminal device 2, and scramble data, these data being sent in from the center 1 at specified intervals, say every two days. These data—channel data and scramble data detected by the FSK receiver 22—are supplied to the control circuit 23, which stores the data in a specified area in memory 25. The channel data stored in the memory 25 consists, for example, of channel numbers and the associated broadcasting stations'names or the availability of broadcast, as shown in FIG. 3.

When a specific channel is selected by operating a key input section 26, the converter 24, under the direction of the control circuit 23, turns in broadcast signals of the selected channel, performs frequency conversion on the received broadcast signals, and outputs IF (intermediate frequency) signal to a descrambler 27. In the descrambler 27, the IF signal is sent to a filter circuit 27a consisting of high-pass and low-pass filters (HPI and LPF), wherein IF video signal (Fv) in the high band area and IF sound signal (Fa) in the low band area are branched.

The Fv signal branched by the filter 27a is sent to an expansion circuit 27d so as to be descrambled here. On the other hand, the Fa signal branched at the filter 27a is further branched at a frequency separator 27b, so that one part thereof is sent to a key signal detector 27c for extracting key signal superposed on the Fa signal.

This key signal includes timing information that specifies the timing when the horizontal synchronous signal portion H of the video signal Fv was compressed, i.e., the timing when the horizontal synchronous signal H should be expanded. By the way, if the selected broadcast signals are not scrambled, the descrambler 27 is bypassed.

In performing the descrambling, the control circuit 23 uses the scramble-related outband data supplied from the FSK receiver 22 and stored in memory 25 and the horizontal synchronous signal expansion timing information obtained from the key signal, in order to decode the data concerning expansion in the horizontal synchronous signal portion of the video signal Fv. The decoded data is fed to the expansion circuit 27d in the descrambler 27, which now descrambles the video signal Fv which was scrambled by the expansion timing signal corresponding to the key signal. When the received video signals are not scrambled, the descrambler 27 is bypassed.

The video intermediate frequency (Fv) signal descrambled by the expansion circuit 27d and the sound intermediate frequency (Fa) signal removed of the key signal at the frequency separator are mixed in a mixing circuit 27e so as to be further supplied to a modulator 28, or alternatively the intermediate frequency signal having bypassed the descrambler 27 as in the case of the TV signals not being originally scrambled is also supplied to a modulator 28, where they are modulated with a specific frequency of the selected channel and then outputted from an output terminal OUT1. The video signal of the selected channel at the output terminal OUT1 is fed to the VCR 3. When the VCR 3 is set to that channel and placed in the record-enable condition, a TV program broadcast on the channel selected by the CATV terminal device 2 is recorded on the VCR 3. The CATV terminal device 2 is provided with a remote control output terminal OUT2 from which to output a remote control code from the control circuit 23 that turns on and off the power of the VCR 3 in response to the CATV terminal device 2 being turned on and off.

The video signal of the channel from the output terminal OUT1 is also fed through VCR 3 to a TV receiver 4. When the TV receiver 4 is set to that particular channel, the program broadcast on the channel chosen by the CATV terminal device 2 can be seen on the TV screen.

The key input section 26, as shown in FIG. 4, consist of a power key 26a, a timer key 26b, ten keys 26c, a up + key 26d, a down − key 26e, and a feed key 26f. The power key 26a is used to turn on and off the power supply; the timer key 26b is operated to preset the start and end time of signal reception; ten keys 26c are used to specify a channel during a normal channel selection procedure, during a program booking procedure, or during a timer's on-off time setting procedure; the up + key 26d and the down − key 26e are used to increment or decrement the channel number or advance or delay the time; and the feed key 26f is used to move to the next setting item. As the key input section 26 is manipulated, the contents of key specification is shown on a display 29. During the channel selection operation, the display 29 shows the selected channel number and the station name of that channel. During the program booking procedure using the timer function, the timer on-off times and channel numbers are displayed.

The setting input to the CATV terminal device 2 can be entered not only by the key input 26 but also by using a remote control transmitter 30 and a remote control receiver 31.

Referring to FIG. 3, the channel data represents correlation between the displayed channel numbers and the corresponding channels to be selected. For instance, in the terminal device that has received the channel data of FIG. 3, when the "1" key of the ten keys 26c on the key input section 26 is pressed, the control circuit 23 uses the channel data contained in memory 25 and chooses the channel "CBS". When the "6" key is pushed, the channel "ABC" is chosen.

The channel data is also used in the program booking procedure. For example, suppose the channel setting is done by manipulating the up + key 26d and that the channel 1 is chosen and displayed on the display 29. When the up + key 26d is pressed again, selecting the channel 2, the control circuit 23 checks against the channel data to find out whether or not this channel is valid. When it is found invalid, this data of channel 2 is not used. The control circuit 23 further checks if the next incremented data of channel number is valid or not. This operation is repeated until valid channel data is found. When a valid channel number is encountered, that channel number is displayed on the display 29. In the data example of FIG. 3, since channel 3 is valid, this channel number is indicated on the display 29. The channel number selected during the program booking procedure is stored in a specified area of the memory 25 together with such data as timer on-off times.

In the above operation, the channel number is set by using the up + and down − keys 26d, 26e. Likewise, when the channel number is set by the ten keys 26c, the control circuit 23 checks whether or not the selected channel number is valid when the feed key 26f is operated after the channel selection. According to the result of the check, the setting is either enabled or disabled.

Figure 5:
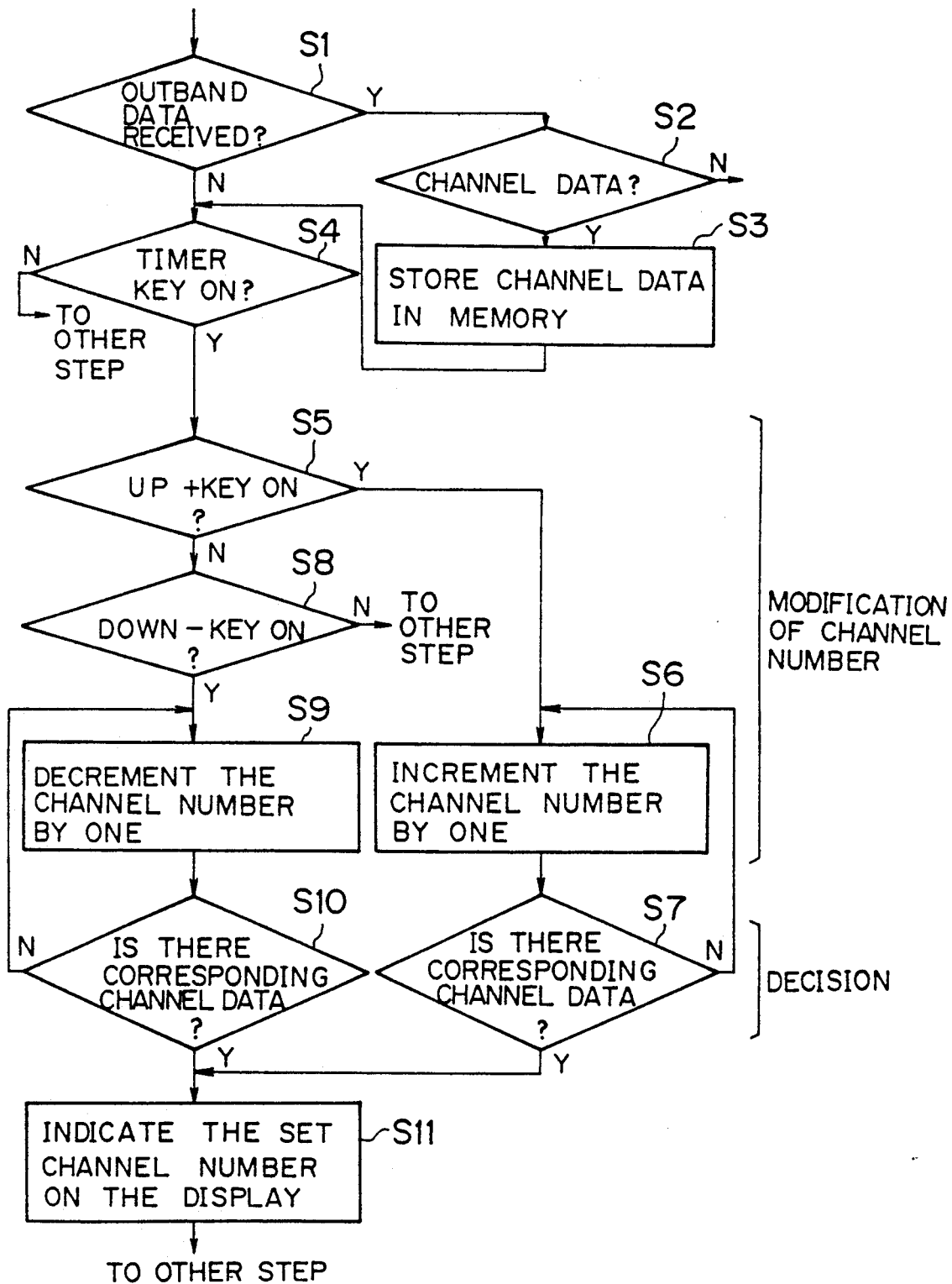
FIG. 5 is a flowchart showing the sequence of operations performed by a controller of FIG. 2.

The above operation of the CATV terminal device 2 will be explained by referring to the flowchart of FIG. 5, which shows the sequence of jobs as performed by the CPU of the control circuit 23 under the directions of a predetermined program.

The CPU of the control circuit 23 checks at step S1 whether or not the outband data is already received from the FSK receiver 22. If so, the program proceeds to step S2. If not, it moves to step S4. At step S2, it is checked if the outband data is the channel data. When the outband data is found to be other than the channel data, the program proceeds to other step not shown. When it is the channel data, the program moves to step S3 where it stores the received outband data in a specified location in memory 25, before going to step S4.

The step S4 checks if the timer key 26b on the key input section 26 is operated. When the key is found to be operated, the program moves to step S5. If not, it goes to other step not shown. At step S5 a check is made of whether the up + key 26d of the key input section 26 has been operated. If so, the program proceeds to step S6 where the preset channel number stored in a specified location in memory 25 is incremented by one.

Then, the program moves to step S7 where it is checked if there is channel data in memory 25 that corresponds to the channel number that was incremented in step S6. If it is decided that there is the associated channel data, the program moves to step S11; if not, it returns to step S6 and repeats the operations of step S6 and S7 until the corresponding channel data is found.

When the decision of step S5 indicates that the up + key 26d is not pressed, the program goes to step S8 to check if the down − key 26e has been operated. If so, the program moves to S9; if not, it moves to other step not shown. At step S9, the preset channel number is decremented by one. At the next step S10, the CPU checks whether or not there is channel data contained in memory 25 that corresponds to the channel number decremented by step S9. If it is decided that there is the corresponding channel data, the program moves to step S11, if not, it returns to step S9 and performs operations of step S9 and S10 until the corresponding channel data is found.

At step S11, the channel number either incremented by step S6 or decremented by step S9 is displayed on the display 29. The program then moves on to succeeding steps.

When the channel number displayed by step S11 is what one wants, a step not shown then checks for the completion of the timer setting procedure, as by checking if the timer key 26b is operated the second time. With the timer setting procedure completed, the channel number thus selected is stored in memory 25 as the channel number to be used for timer function. Although in the above explanation we did not describe the procedure of setting the start and end times of the timer function, it can be carried out by the known method, for example, by using the ten keys 26c and feed key 26f.

The advantages of this invention may be summarized as follows. When a channel number not available for reception is erroneously selected during the timer setting procedure, the selected channel number is automatically changed to a channel number that can be used for TV program reception. This prevents the selection of invalid channels. In other words, even when an invalid channel should be selected, there is no possibility that the invalid channel on which no video signals can be received will be set. This means that when a timer is used to record a TV program by VCR and a wrong channel setting is made on the timer, the VCR can be prevented from recording noise for the present period of time.

What is claimed is:

1. A terminal device for a cable television receiver having a timer, operable in conjunction with a program booking timer function in which a user may select channels to be received at predetermined future times, to turn on a selected television program at a preset time comprising:

first memory means for storing selected channel numbers for selected TV programs to be received at said predetermined future times;

second memory means for storing channel data containing information about active channels for TV programs, said channel data being sent from a cable television transmitter to said cable television receiver;

decision means for deciding whether or not each channel number stored in said first memory means is an active channel number for reception by referring to the data stored in said second memory means; and channel number switching means to change each channel number stored in said first memory means to an active channel number based on an output signal from said decision means.

2. A terminal device as claimed in claim 1, wherein the channel numbers to be stored in said first memory means are selected by a key operation.

3. A terminal device as claimed in claim 1, wherein the channel data stored in said second memory means are received through outband data being transmitted.

4. A terminal device as claimed in claim 3, said outband data further contains scramble data for decoding scrambled television signals.

5. A terminal device as claimed in claim 1, wherein said decision means and channel number switching means are integrated in a control circuit.

6. A terminal device as claimed in claim 5, wherein said control circuit consists of a CPU to perform predetermined operational steps.

7. A terminal device as claimed in claim 1, wherein the change in said channel number switching means is incremental or decremental from the selected channel number to one of the active channels contained in the channel data stored in said second memory means.

8. A terminal device as claimed in claim 7, wherein said selected channel number is written into said first memory means by operating an up-key for stepping up the channel number one at a time and a down-key for stepping down the channel number one at a time.

* * * * *